(12) United States Patent
Ziglioli

(10) Patent No.: US 10,770,432 B2
(45) Date of Patent: Sep. 8, 2020

(54) ASICS FACE TO FACE SELF ASSEMBLY

(71) Applicant: STMicroelectronics S.r.l., Agrate Brianza (IT)

(72) Inventor: Federico Giovanni Ziglioli, Pozzo d'Adda (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 9 days.

(21) Appl. No.: 15/919,871

(22) Filed: Mar. 13, 2018

(65) Prior Publication Data

US 2019/0287944 A1 Sep. 19, 2019

(51) Int. Cl.
*H01L 23/48* (2006.01)
*H01L 25/065* (2006.01)
(Continued)

(52) U.S. Cl.
CPC ........ *H01L 25/0657* (2013.01); *H01L 21/288* (2013.01); *H01L 21/76802* (2013.01); *H01L 21/76877* (2013.01); *H01L 23/3142* (2013.01); *H01L 23/528* (2013.01); *H01L 24/27* (2013.01); *H01L 24/32* (2013.01); *H01L 24/83* (2013.01); *H01L 25/50* (2013.01); *H01L 2224/32145* (2013.01); *H01L 2224/838* (2013.01); *H01L 2224/83143* (2013.01); *H01L 2224/83191* (2013.01); *H01L 2224/83851* (2013.01); *H01L 2224/83855* (2013.01); *H01L 2225/06551* (2013.01); *H01L 2225/06555* (2013.01); *H01L 2225/06593* (2013.01); *H01L 2924/1433* (2013.01)

(58) Field of Classification Search
CPC ....... H01L 2224/32145; H01L 25/0657; H01L 2224/97; H01L 2924/07811; H01L 2225/06551; H01L 2224/16145; H01L 2224/24145; H01L 2224/83851; H01L 2224/83871–83874
See application file for complete search history.

(56) References Cited

U.S. PATENT DOCUMENTS 5,045,249 A 9/1991 Jin et al.
5,438,224 A 8/1995 Papageorge et al.
(Continued)

OTHER PUBLICATIONS

"Conductive Compounds Information," Engineering 360, retrieved from https://www.globalspec.com/learnmore/materials_chemicals_adhesives/industrial_adhesives/conductive_adhesives_compounds, retrieved on Mar. 12, 2018, 5 pages.
(Continued)

*Primary Examiner* — Allen L Parker
*Assistant Examiner* — Wasiul Haider
(74) *Attorney, Agent, or Firm* — Seed IP Law Group LLP

(57) ABSTRACT

A die structure includes a first die having a first surface and a second surface opposite the first surface. The first die includes sidewalls extending between the first and second surfaces. The die structure includes conductive ink printed traces including a first group of the conductive ink printed traces on the first surface of the first semiconductor die. A second group of the conductive ink printed traces are on the second surface of the semiconductor die, and a third group of the conductive ink printed traces are on the sidewalls of the semiconductor die.

16 Claims, 8 Drawing Sheets

(51) Int. Cl.
*H01L 23/00* (2006.01)
*H01L 23/31* (2006.01)
*H01L 21/768* (2006.01)
*H01L 25/00* (2006.01)
*H01L 21/288* (2006.01)
*H01L 23/528* (2006.01)

(56) References Cited

U.S. PATENT DOCUMENTS

| | | | |
|---|---|---|---|
| 5,522,962 | A | 6/1996 | Koskenmaki et al. |
| 5,814,881 | A | 9/1998 | Alagaratnam et al. |
| 6,121,119 | A * | 9/2000 | Richards ............... H01C 1/14 |
| | | | 438/462 |
| 6,584,681 | B2 | 7/2003 | Lorenz et al. |
| 8,802,214 | B2 | 8/2014 | Liang et al. |
| 2003/0096454 | A1* | 5/2003 | Poo ....................... H01L 23/481 |
| | | | 438/109 |
| 2003/0121602 | A1 | 7/2003 | Hsieh et al. |
| 2011/0284262 | A1* | 11/2011 | Chappell ................ B29C 70/62 |
| | | | 174/126.1 |
| 2012/0089180 | A1 | 4/2012 | Fathi et al. |
| 2012/0159778 | A1* | 6/2012 | Krueger .................. H01L 24/94 |
| | | | 29/830 |
| 2012/0217644 | A1* | 8/2012 | Pagaila ................... H01L 24/03 |
| | | | 257/774 |
| 2015/0107765 | A1 | 4/2015 | Khanna |
| 2015/0162309 | A1* | 6/2015 | Vincent ............... H01L 25/0657 |
| | | | 257/777 |

OTHER PUBLICATIONS

"SunRay Scientific ZTACH anisotropic conductive adhesives for assembly of LEDs," LEDs Magazine, Jul. 12, 2010, retrieved from http://ledsmagazine.com/ugc/2010/07/sunray-scientific-ztach-anisotropic-conductive-adhesives-for-assembly-of-leds.html, retrieved on Oct. 13, 2017, 3 pages.

Ramkumar et al., "A Novel Anisotropic Conductive Adhesive for Lead-Free Surface Mount Electronics Packaging," *J. Electron. Packag* 129(2):149-156, 2006. (Abstract only).

Von Trapp, "The Future of Image Sensors in Chip Stacking," 3DInCites, Sep. 15, 2014, retrieved from https://www.3dincites.com/2014/09/future-image-sensors-chip-stacking/, retrieved on Oct. 13, 2017, 5 pages.

* cited by examiner

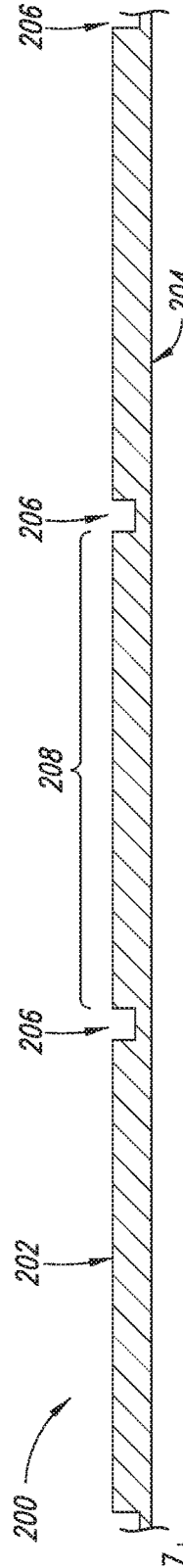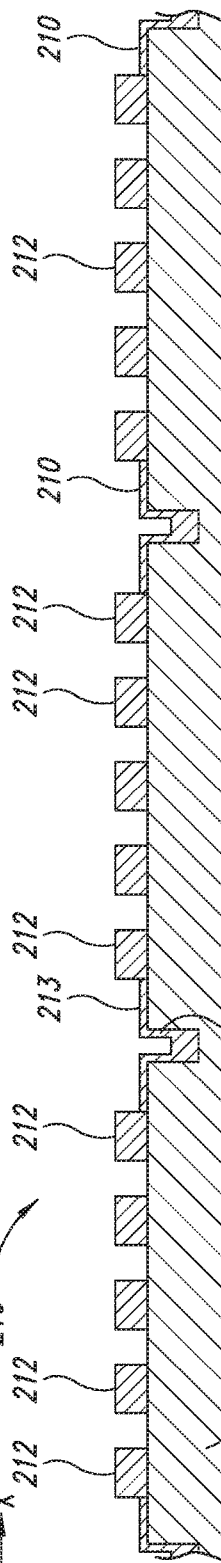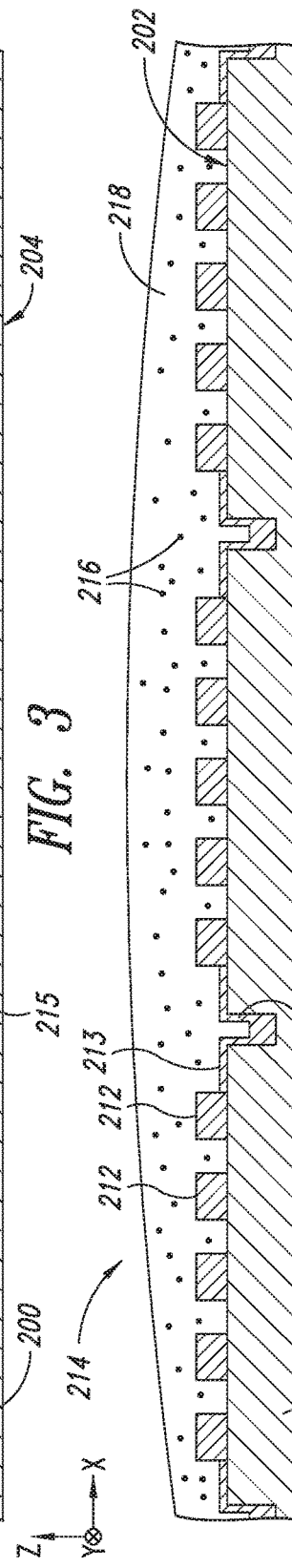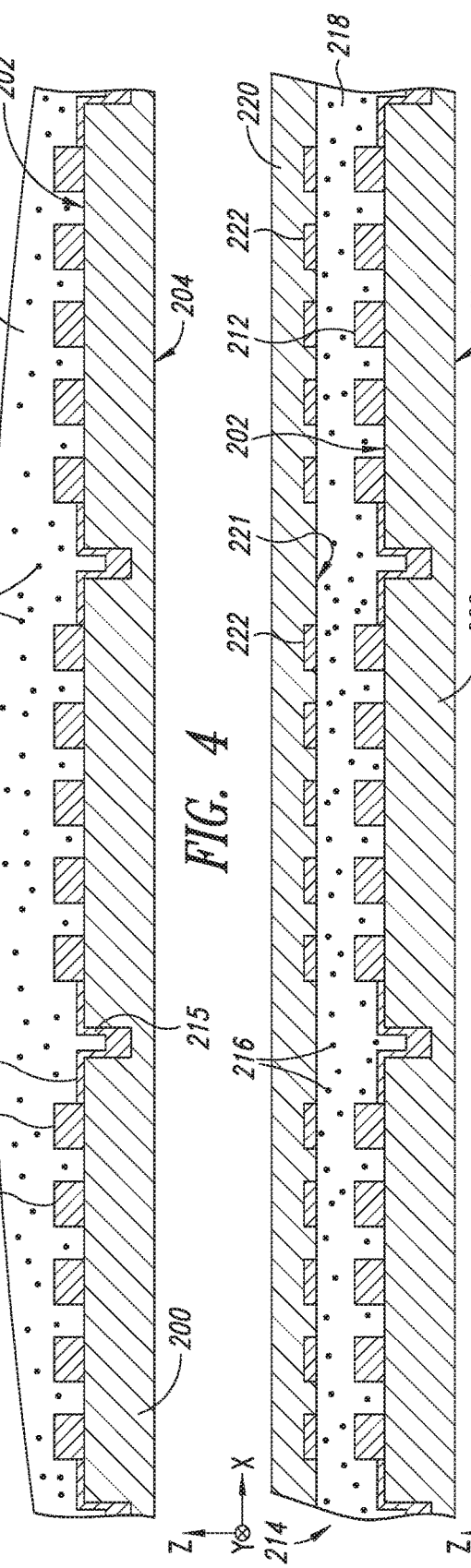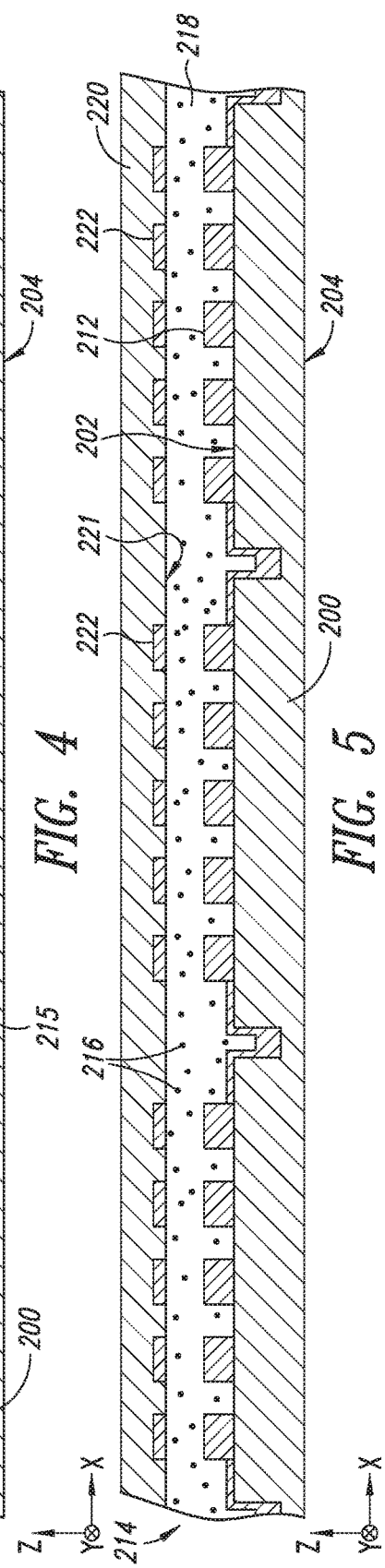

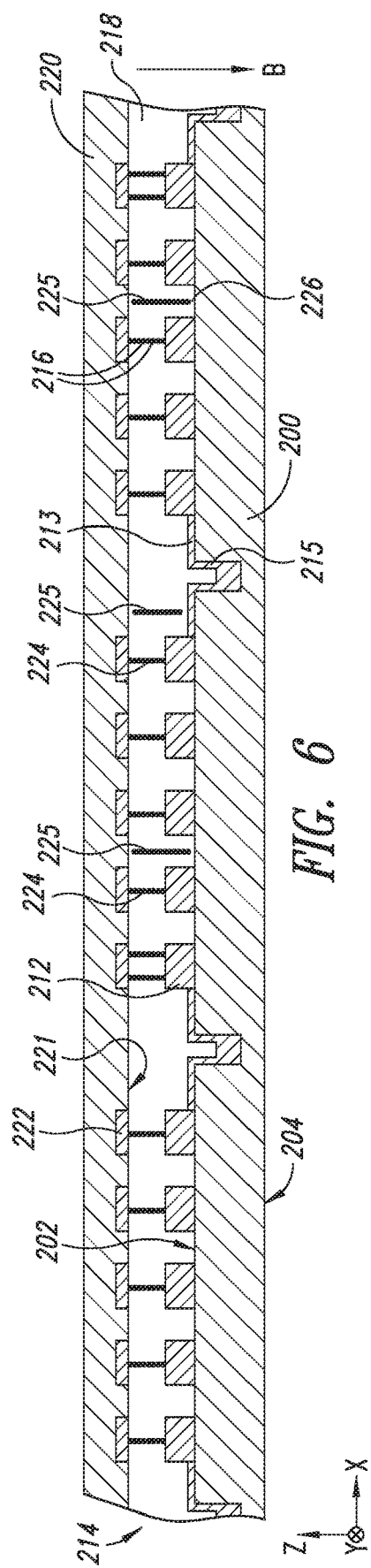
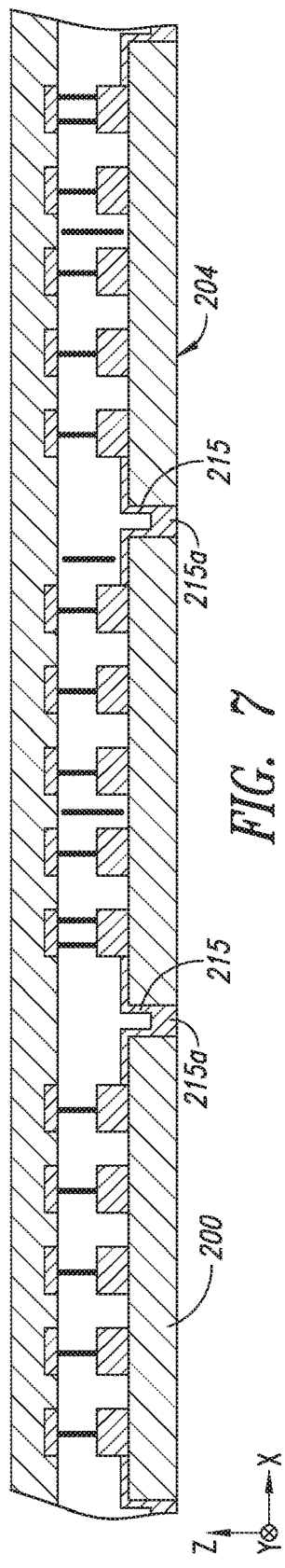
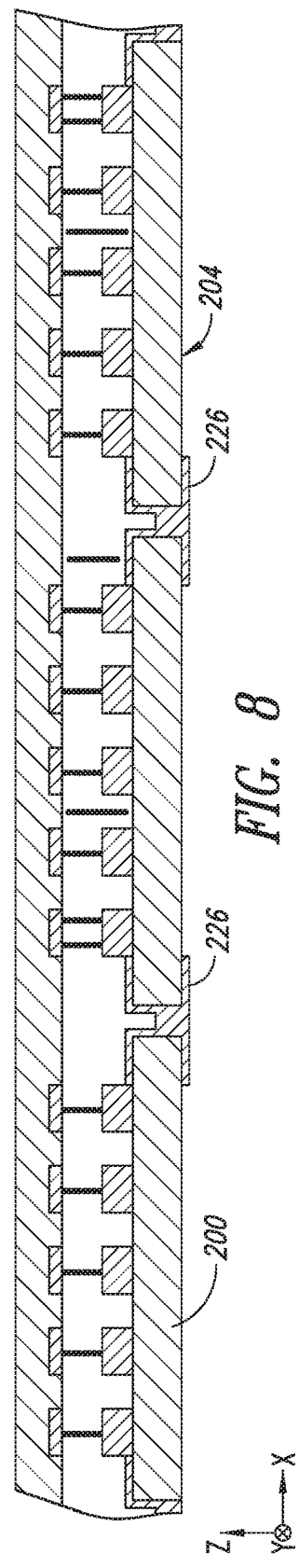
FIG. 6
FIG. 7
FIG. 8

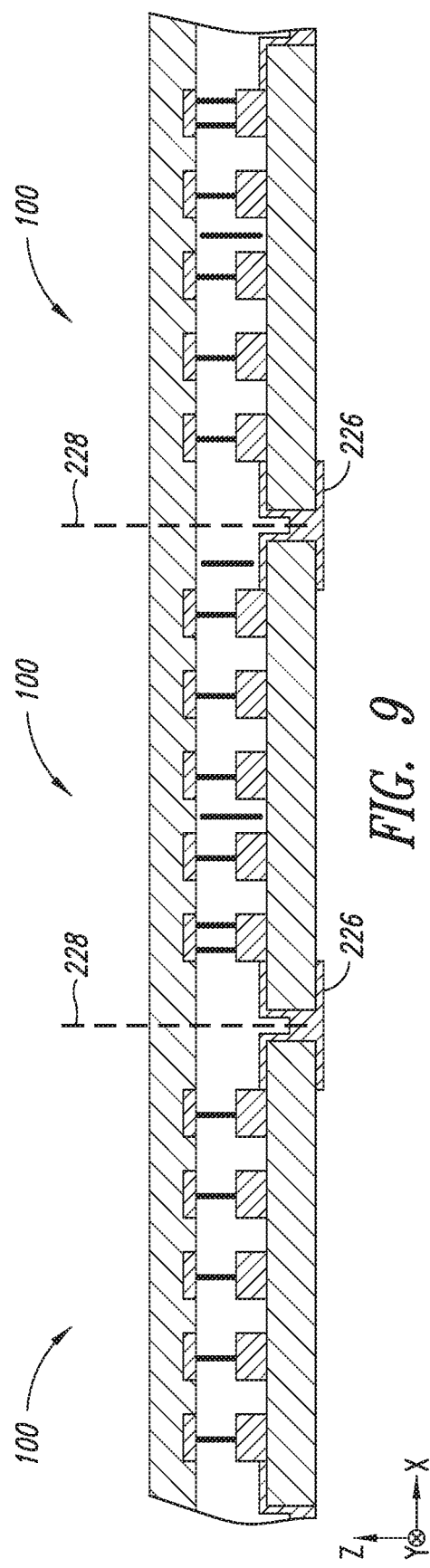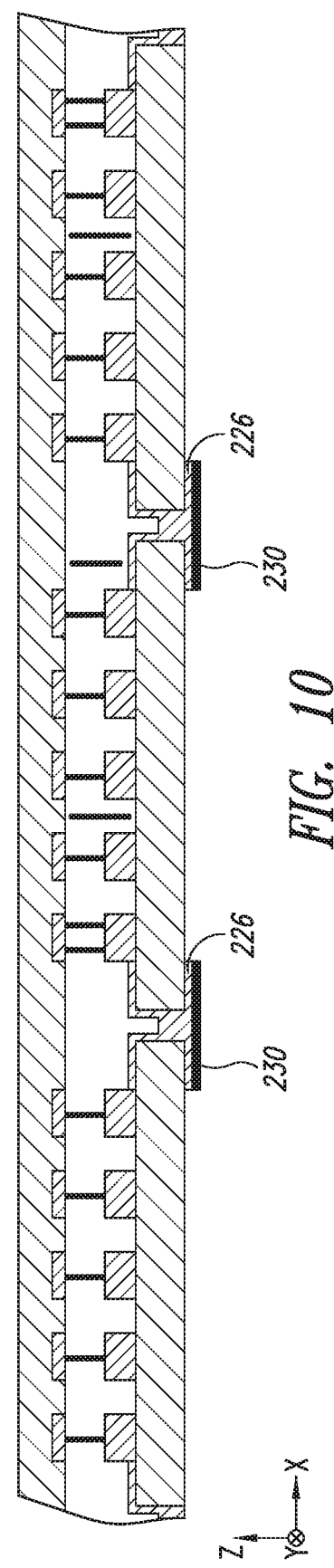

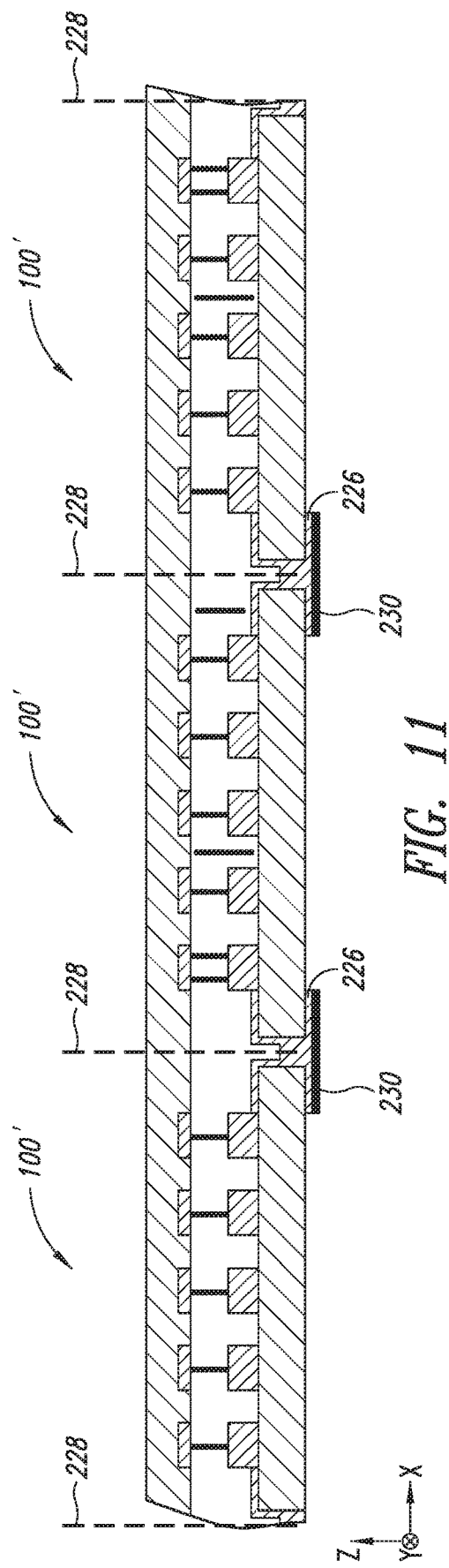

ASICS FACE TO FACE SELF ASSEMBLY

BACKGROUND

Technical Field

The present disclosure relates generally to the interconnection of integrated circuits, and more specifically to a simplified interconnection structure including anisotropic conductive paste and printed conductive traces.

Description of the Related Art

Modern electronic devices include large numbers of integrated circuits or chips that perform increasingly complex functions. These chips have become smaller and are more densely packed in electronic devices as the devices have become smaller, which makes providing the required interconnections among the chips more difficult. At the same time, the number of interconnections among chips continues to increase to support more complex functionality of the chips and overall functionality of electronic devices. To increase chip density or chips per unit volume, at least some of the chips are stacked vertically instead of being positioned next to each other on a printed circuit board or other substrate. While stacking of chips increases chip density, the structures and processes required to do so may complicate the overall assembly process of physically stacking and electrically interconnecting the chips in a package structure having a reduced volume. There is accordingly a need for improved structures and methods of packaging and interconnecting chips in electronic devices.

BRIEF SUMMARY

In one embodiment of the present disclosure, a first die includes a first surface and a second surface opposite the first surface, with sidewalls of the first die extending between the first and second surfaces. Conductive ink printed contacts are formed on the first and second surfaces of the first die. Conductive ink printed conductive traces are formed on the sidewalls of the first die and interconnect at least some of the conductive ink printed contacts on the first surface to at least some of the conductive ink printed contacts on the second surface.

In another embodiment, a second die is coupled to the first die through an anisotropic conductive paste that includes an encapsulant and a plurality of magnetic beads. The second die includes contacts on a surface of the second die facing the first die. These contacts are electrically coupled to the conductive ink printed contacts formed on the first surface of the first die through the plurality of magnetic beads of the anisotropic conductive paste. The magnetic beads are aligned upon application of a magnetic field during a curing process to form electrical connections between the contacts on the second die and contacts on the first surface of the first die.

BRIEF DESCRIPTION OF THE SEVERAL VIEWS OF THE DRAWINGS

FIGS. 2-11 illustrate an assembly process of the package of FIG. 1 according to one embodiment of the present disclosure;

DETAILED DESCRIPTION

Figure 1:
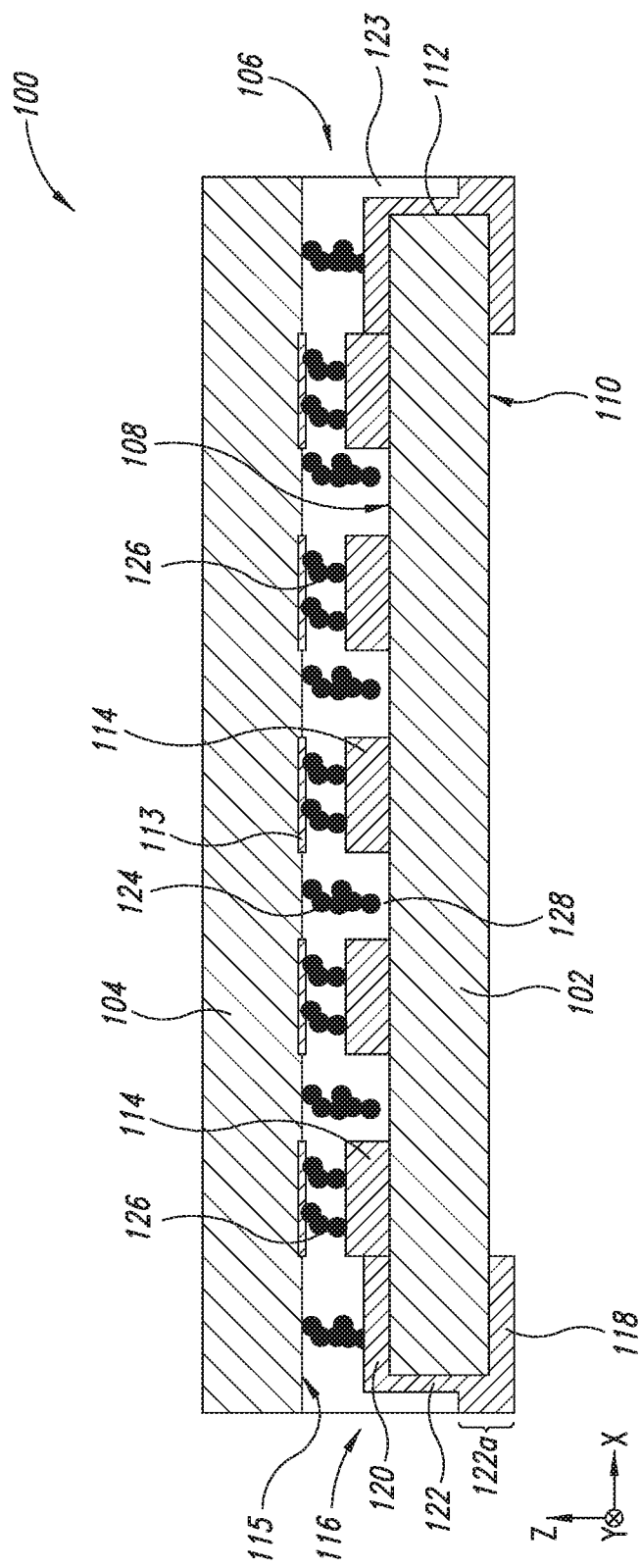
FIG. 1 is a cross-sectional view of a package including two stacked die coupled through an interconnection structure according to one embodiment of the present disclosure.

FIG. 1 is a cross-sectional view of a package 100 including a first semiconductor die 102 and second semiconductor die 104 that are coupled through an interconnect structure 106 according to one embodiment of the present disclosure. The second die 104 is stacked on the first die 102 and the two dies are electrically interconnected through the interconnect structure 106. The first die 102 includes a first surface 108 and a second surface 110 opposite the first surface, with sidewalls 112 extending between the first and second surfaces. The interconnect structure 106 can also provide access on the second surface 110 of the first die 102 to partially-recessed conductive contacts 113 formed on a first surface 115 of the second die 104 that is facing the first die 102. In one embodiment, the interconnect structure 106 is formed by contacts and traces formed from a conductive ink that is printed on portions of the surface 108, sidewalls 112 and surface 110 of the first die 102, as will be described in more detail below.

In the present description, certain details are set forth in conjunction with the described embodiments to provide a sufficient understanding of the present disclosure. One skilled in the art will appreciate, however, that embodiments of the disclosure may be practiced without these particular details. Furthermore, one skilled in the art will appreciate that the present disclosure is not limited to the example embodiments described herein, and will also understand that various modifications, equivalents, and combinations of the disclosed embodiments and components of such embodiments are within the scope of the present disclosure. Embodiments including fewer than all the components of any of the respective described embodiments may also be within the scope of the present disclosure although not expressly described in detail below. The operation of well-known components and/or processes has not been shown or described in detail below to avoid unnecessarily obscuring the present disclosure. Finally, components that are common among the described embodiments are given the same reference numbers or descriptors in the present application even though the detailed operation of such components may vary among embodiments.

The cross-sectional view of the package 100 is a view in the XZ-plane as defined by the axes shown in the lower left portion of the figure. Formed on the first surface 108 of the first die 102 are a plurality of conductive contacts 114, with at least some of these conductive contacts on the upper surface being electrically coupled through a lateral interconnect structure 116 to conductive contacts 118 formed on the second surface 110 of the first die 102. The lateral interconnect structure 116 includes a first conductive portion or trace 120 formed on the surface 108 and coupled to a corresponding one or ones of the conductive contacts 114. The conductive trace 120 is coupled to a lateral conductive portion or trace 122 of the lateral interconnect structure 116 that is also formed on the sidewalls 112 of the first die 102. The lateral conductive trace 122 is also coupled to the conductive contacts 118 on the surface 110 of the first die 102.

In this way, the lateral interconnect structure 116 couples conductive contacts 114 on the upper surface 108 of the first die 102 through the upper conductive portions 120 and lateral conductive portions 122 to conductive contacts 118 on the second surface 110. The lateral interconnect structure 116 is referred to as a "lateral" structure because this structure includes portions on the sides, namely sidewalls 112, of the die 102. In one embodiment, the lateral conductive trace 122 includes a first portion having a first thickness in a direction parallel to the X-axis and a second portion 122a extending from the first portion to the contact 118. The second portion 122a has a second thickness that is greater than the first thickness in one embodiment, as will be described in more detail below.

Each of the first and second dies 102, 104 includes an integrated circuit formed in the die and may be an application specific integrated circuit (ASIC). The interconnect structure 106 electrically interconnects electrical components of the integrated circuit in the first die 102 to electrical components of the integrated circuit in the second die 104. In addition, the interconnect structure 106 can provide direct electrical connection between the integrated circuit in the second die 104 and an external electronic circuit (not shown) to which the package 100 is electrically coupled, as will be described in more detail below.

The interconnect structure 106 further includes an anisotropic conductive paste (ACP) that includes an encapsulant 123 and a plurality of magnetic beads or bodies 124. The second die 104 includes the conductive contacts 113 formed on the surface 128 of the second die that is facing the first die 102. These contacts 113 are electrically coupled to the contacts 114 on the first surface 108 of the first die 102 through the magnetic beads 124 of the anisotropic conductive paste. As will be described in more detail below, the magnetic beads 124 are aligned upon application of a magnetic field during a curing process of the anisotropic conductive paste to form electrical connections 126 between the contacts 113 on the surface 115 of the second die 104 and the contacts 114 on the first surface 108 of the first die 102. The magnetic beads 124 are formed from a suitable electrically conductive material that can be magnetized, such as a ferromagnetic material.

As will be appreciated by those skilled in the art, anisotropic conductive paste (ACP) may be utilized to form conductive paths between aligned contacts on an integrated circuit or chip and a contact on another chip or substrate such as a printed circuit board (PCB). The ACP includes the magnetic beads 124, suspended in the encapsulant 123, which is an electrically insulating material. The ACP is formed in an uncured state between the first and second dies 102, 104, and is thereafter cured in the presence of a magnetic field B that aligns the magnetic beads to form the electrical connections 126 between pairs of the contacts 114 and 126, as will be described in more detail below.

FIG. 1 illustrates that a plurality of electrical connections 126 are typically formed between pairs of contacts 113, 114 by showing two electrical connections 126 formed between each aligned pair of contacts. In actual embodiments, a large number, many more than two, of such electrical connections 126 would typically be formed between aligned pairs of contacts 113, 114. The exact number of such electrical connections 126 varies and depends in part on the size of the magnetic beads 124 in the encapsulant 123, the number of beads in the encapsulant, and the strength of the magnetic field applied during curing of the anisotropic conductive paste.

The encapsulant 123 is made from an electrically insulating material that toughens or hardens during a suitable curing process. The curing process may include, for example, the application of heat, or light (i.e., electromagnetic radiation) of a particular wavelength, to the encapsulant 123, as will be appreciated by those skilled in the art. The cured or hardened encapsulant 123 secures the aligned magnetic beads 124 in position extending between the contacts 113 and 114 to permanently form the electrical connections 126. In this way, after the curing process is completed the magnetic field B may be removed while the formed electrical connections 126 remain to electrically interconnect the contacts 114, 126.

One skilled in the art will appreciate suitable conductive ink printing processes to form the contacts 114, 118 and conductive portions or traces 120, 122 on the first die 102, and other ink printed traces and contacts discussed herein. The contacts may, for example, correspond to ink printed thin bumps printed on the corresponding surface, with these ink printed thin bumps having a thickness extending from the surface that is greater than a thickness of the associated printed conductive traces coupled to these ink printed thin bumps. Each ink printed bump is formed as a flat, layer, having a relatively consistent thickness. In cross-section, each bump can have a rectangular shape. In one embodiment, the conductive contacts 114 are printed from conductive ink and have a thickness of 10-30 micrometers, where the thickness is a direction parallel to the Z-axis and accordingly orthogonal to the surfaces 108 and 115 that are each in the XY-plane. The ink printed traces also have a consistent thickness, in that they are formed as a layer on the surface of the die. They may be formed on top of and in direct contact with contact pads (not shown) formed in each die. In cross-section, the ink printed traces can have a rectangular shape.

The conductive traces 120 formed on the surface 108 of the first die 102 have thickness that is less than a thickness of the contacts 114 formed on this surface. The increased thickness of contacts 114 results in an exposed surface of these contacts being closer to the surface 115 of the second die 104 than exposed surfaces of conductive traces 120. This results in electrical connections 126 being formed between the contacts 113 and 114 as desired, and not at unwanted locations on the surfaces 108 and 115 where contacts 113, 114 are not present. As seen in FIG. 1, where the magnetic beads 124 align between the surfaces 108, 110 at locations where no contacts 113, 114 are present, the aligned magnetic beads do not extend all the way between surfaces 108. 115 but stop short of at least one of these surfaces so there is at least one gap 128 between these surfaces and the aligned magnetic beads. In the interconnect structure 106, the contacts 114, 118 and conductive traces 120, 122 collectively form a redistribution layer on the upper surface 108 of the first die 102. This redistribution layer functions to position or distribute contacts 114 on the upper surface 108 to provide required electrical interconnection between the dies 102, 104 through the electrical connections 126. In addition, this redistribution layer provides desired external electrical connections to the electronic circuitry in each of the dies through the contacts 118 on the surface 110 of the first die 102. More specifically, the lateral interconnect structure 116 provides desired direct electrical connections to the second die 104 through contacts 118, lateral conductive traces 122, conductive traces 120, and contacts 114. In this situation where direct electrical connection is to be provided to the second die 104, the contacts 114, conductive traces 120, lateral conductive traces 122, and contacts 118 are formed on the upper surface 108, sidewalls 112, and surface 110 of the first die 102 but are not electrically connected to first die 102. The redistribution layer can also provide on through contacts 118 direct electrical connection to desired contacts on the surface 108 of the first die 102. In this situation, the redistribution layer formed by the interconnect structure 106 routes desired ones of the contacts 114 on the surface 108 of the first die 102 to contacts 118 on the surface 110 of the first die to provide external access to these contacts.

In one embodiment of the present disclosure, such as the package 100 in the embodiment of FIG. 1, conductive ink printed traces are printed on the first die 102 and these conductive ink printed traces include first, second and third groups of conductive ink printed traces. The first group of the conductive ink printed traces is on the first surface of the first semiconductor die 102 and includes the conductive traces 120 in the package 100 of FIG. 1. This first group may also include the conductive contacts 114. The second group of the conductive ink printed traces is on the second surface 110 of the first semiconductor die 102, and corresponds to the contacts 118 in the embodiment of FIG. 1. Finally, the third group of the conductive ink printed traces is on the sidewalls 112 of the semiconductor die 102, and corresponds to the lateral conductive traces 122 in the embodiment of FIG. 1.

FIGS. 2-11 illustrate an assembly process of a package that is similar to the package 100 of FIG. 1 according to another embodiment of the present disclosure. FIG. 2 is a cross-sectional view of a portion of a wafer 200 including a first surface 202 and second surface 204 with trenches, cuts or grooves 206 formed in the first surface. The grooves 206 extend partially towards the second surface through a thickness of the wafer extending parallel to the Z-axis between the upper and surfaces 202, 204. Die portions 208 of the wafer 200 between the grooves 206 correspond to the first die 102 of FIG. 1 at the end of the assembly process, as will be described in more detail below.

As seen in FIG. 3, a layer of conductive ink 210 is printed in the grooves 206 and on portions of the surface 202 of the wafer 200. This layer of conductive ink 210 is printed to form conductive contacts 212 and conductive traces 213 on the surface 202 of the wafer 200. A thickness of the conductive contacts 212 in a direction parallel to the Z-axis is greater than a thickness of the conductive traces 213 in the illustrated embodiment. In the grooves 206, the conductive ink is printed to conformally coat the sidewalls and a bottom wall of each of the trenches 206 to form lateral conductive traces 215. A thickness of the lateral conductive traces 215 on the bottom wall of each trench 206, and thus a thickness in a direction parallel to the Z-axis, is greater than a thickness of the lateral conductive traces formed on the sidewalls of each trench (i.e., a thickness in a direction parallel to the X-axis). The layer of conductive ink 210 is not printed to cover entirely each of the grooves 206, but is printed in the grooves where the lateral conductive traces 215 are to be formed. This is illustrated and will be discussed below in more detail with reference to FIGS. 12 and 13.

In the embodiment of FIG. 3, the layer of conductive ink 210 printed on the bottom wall of the grooves 206 is thicker than the layer of conductive ink formed on the sidewalls of the grooves as just discussed. In other embodiments, a thickness of the layer of conductive ink 210 printed on the bottom walls of the grooves 206 is the same as the thickness of the layer of conductive ink printed on the sidewalls and upper surface 202. In the embodiments of FIGS. 3-11, the layer of conductive ink 210 is printed conformally on the sidewalls and bottom wall the grooves 206. In another embodiment of the present disclosure, the conductive ink is printed to entirely fill the grooves 206 at desired locations, namely where the lateral conductive traces 215 are to be formed.

The patterning of the layer of conductive ink 210 printed on the surface 202 of a die portion 208 varies in different embodiments of the present disclosure. In the example embodiment described with reference to FIGS. 3-11, one or more layers of the conductive ink 210 are printed on portions of the surface 202 to form the conductive contacts 212 having a desired thickness relative to the conductive traces 213 formed on the surface. The printed conductive traces 213 are shown in FIG. 3 coupled to contacts 212 proximate a periphery of each die portion 208 (i.e., near the grooves 206 that define each die portion). The printed conductive traces 213 may printed on the surfaces 202 to be coupled to contacts 212 positioned on the interior of the surface of the 202 (i.e., not adjacent the grooves 206), as will be described in more detail below with reference to FIGS. 12 and 13. The patterning of the layer of conductive ink 210 on the upper surface 202 of the wafer 200 includes the formation of other conductive components on the upper surface through the printing of the layer of conductive ink in further embodiments of the present disclosure.

FIG. 4 shows dispensing of an anisotropic conductive paste 214 on the surface 202 of the wafer 200 and on the contacts 212, conductive traces 213, and the lateral conductive traces 213 formed in the grooves 206. At this point in FIG. 4, the anisotropic conductive paste 214 has not yet been cured and accordingly includes a plurality of magnetic bodies or beads 216 somewhat equally dispersed throughout an encapsulant 218 of the anisotropic conductive paste. The encapsulant material 218 is a suitably viscous material that does not simply flow off the surface 202 of the wafer 200 but adheres to this surface along with the contacts 212 and traces 213, 215.

In FIG. 5, a second wafer 220 is placed on the anisotropic conductive paste 214. The anisotropic conductive paste 214 at this point has not yet been cured, and thus the magnetic beads 214 remain somewhat equally dispersed throughout the encapsulant 218. The second wafer 220 includes a surface 221 that is placed on the encapsulant 218 of the anistropic conductive paste 214 and thus facing the surface 202 of the first wafer 200.

In FIG. 6, the anisotropic conductive paste 214 is cured in the presence of a suitably oriented magnetic field B that causes the magnetic beads 216 to align between the contacts 222 formed on the surface 221 of the second wafer 220 and the contacts 212 formed on the surface 202 of the first wafer 200. The magnetic beads 214 align between the contacts 222 and 212 to form electrical connections 224 extending between these contacts. At the same time, because the encapsulant 218 is being cured, the encapsulant hardens or toughens to thereby secure the aligned magnetic beads 216 in position to permanently form the electrical connections 224 such that even after the magnetic field B is removed the electrical connections remain to electrically interconnect the contacts 222 and 212. The hardened or toughened encapsulant 218 also physically attaches or secures the second wafer 220 to the first wafer 200 to form the stacked structure of FIG. 6 including the electrical connections 224 between electronic circuitry formed in respective die portions 208 (FIG. 2) of each of the first and second wafers 200, 220.

As seen in FIG. 6, each contact 222 is electrically connected through one or more conductive electrical connections 224 to the corresponding contact 212 on the surface 202 positioned underneath the contact. Upon application of the magnetic field B, the magnetic beads 216 align parallel to the direction of the magnetic field and accordingly extend vertically in the figure (parallel to the Z-axis) to provide the desired electrical connections 224. Although only a single electrical connection 224 is shown in FIG. 6 extending between most of the pairs of contacts 222 and contacts 212 on the surface 202, in actuality a plurality of such electrical connections are actually formed. This could include a relatively large number of electrical connections 224 between each pair of contacts 222, 212. These electrical connections 224 are formed in parallel between the pairs contacts 222, 212, and collectively provide the desired electrical interconnection between each pair of contacts.

FIG. 6 also illustrates that the magnetic beads 216 may also align vertically (i.e., parallel to the Z-axis) between the first wafer 200 and the second wafer 220 even where contacts are not formed on either of the wafers. Several such alignments 225 are shown in FIG. 6. These alignments 225 of magnetic beads 216 where contacts 222, 212 are not present on the wafers 200, 220 does not affect the operation of the integrated circuits in the wafers 200, 220. This is true because no electrical interconnection of the integrated circuits is being provided through these alignments of magnetic beads 216. These alignments 225 do not contact one or both of the surfaces 202 and 221 no electrical connection results between the integrated circuits in the wafers 200, 220.

FIG. 7 illustrates a back etching or grinding operation that occurs after completion of the curing process of FIG. 6. In FIG. 7, a back etching or grinding operation is performed to remove a portion of the surface 204 of the wafer 200 and expose portions of the lateral conductive traces 215 formed in the grooves 206. These portions are labelled 215a in FIG. 7. As seen in FIG. 8, a back side conductive layer is then printed or deposited on the surface 204 of the wafer 200 to form electrical contacts 226 to each of the lateral conductive traces 215 formed in each of the trenches or grooves 206. In FIG. 9, the structure of FIG. 8 is then singulated or cut as indicated by vertical dashed lines 228 to isolate or singulate the respective structures between adjacent grooves 206, each of which corresponds to the package 100 of FIG. 1. FIG. 10 illustrates the formation of an additional plating layer 230 of a suitable conductive material on the electrical contacts 226 if desired, with FIG. 11 then illustrating singulation of structure of FIG. 10 to form the respective structures 100' including this additional plating layer 230.

Figure 12:
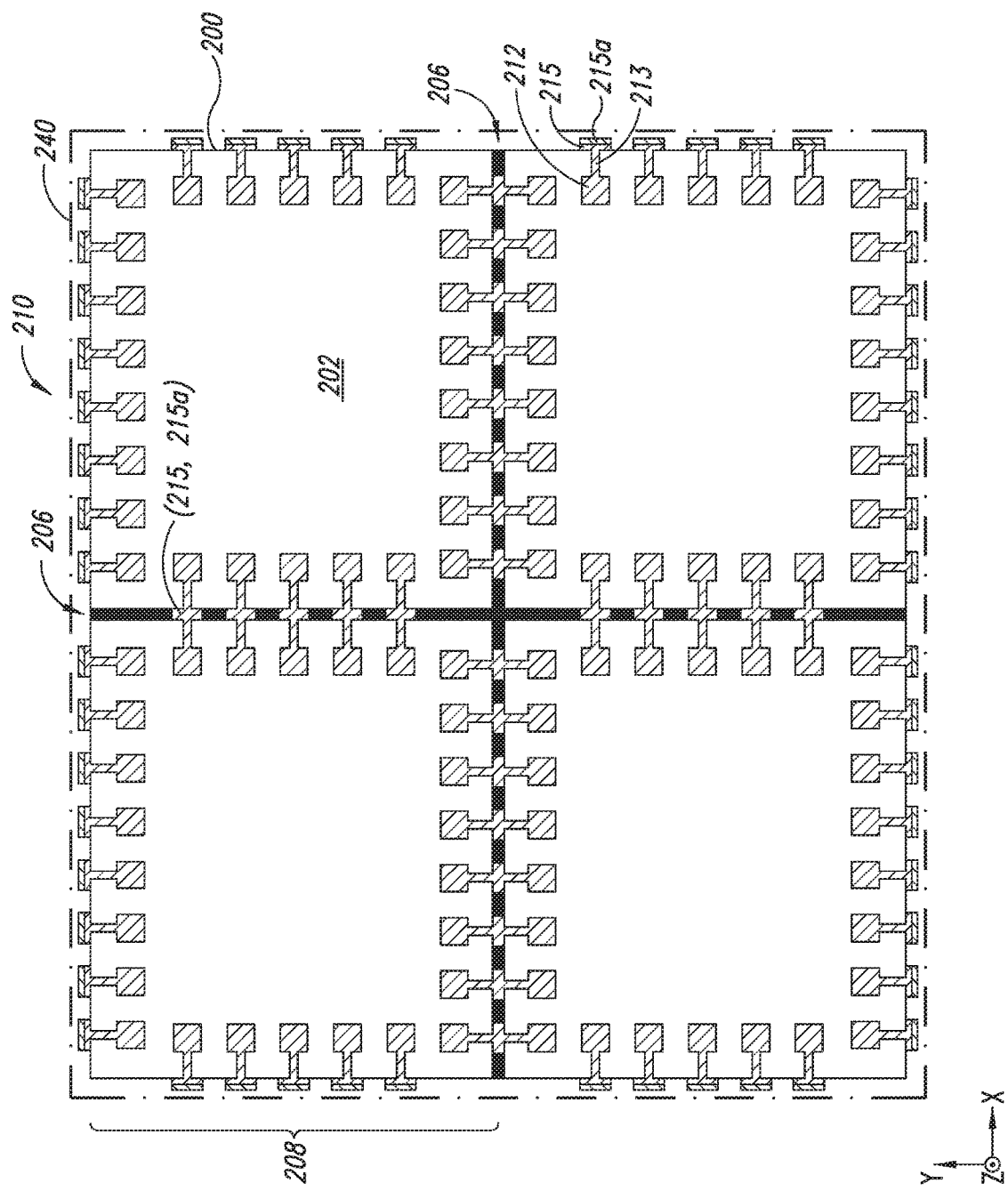
FIG. 12 is a top view showing a portion of the wafer of FIG. 3 that illustrates ink printed peripheral contact pads and traces formed on this wafer.

FIG. 12 is a top view showing a portion of the wafer 200 of FIG. 3 that illustrates the layer of conductive ink 210 printed in the grooves 206 (FIG. 2) and on the upper surface 202 of the wafer. Four different die portions 208 are shown in FIG. 12, with only the upper leftmost die portion being labelled. As shown in FIG. 12, the layer of conductive ink 210 is not printed to entirely cover or fill each of the grooves 206 separating the die portions 208. Instead, the layer of conductive ink 210 is printed at locations in the trenches where the lateral conductive traces 215, which include the portions 215a of these lateral conductive traces, are to be formed.

In the embodiment of FIG. 12, the conductive ink 210 is printed on the upper surface 202 of the wafer 200 to form peripheral contact pads or contacts 212 and conductive traces 213. These peripheral contacts 212 are termed "peripheral" contacts because they are formed on the "periphery" of each die portion 208 of the wafer 200 defined between adjacent trenches 206. Each such die portion 208 has a periphery defined by the adjacent trenches 206 and upon singulation, as discussed previously with reference to FIGS. 9 and 11, the cuts along these trenches of each die portion 208 forms a die such as the first die 102 of FIG. 1. The conductive traces 213 couple each peripheral contact 212 to a corresponding lateral conductive trace 215 formed on the sidewalls and bottom wall of the grooves 206. The location of the printing of the layer of conductive ink 210 in the trenches 206 determines the locations of the lateral conductive traces 215.

The cutting of the die portions 208 is represented in FIG. 12 by the dash-dot-dash line 240 around the periphery of the four shown die portions 208 shown. To singulate each of the die portions 208 shown in FIG. 12, the four illustrated die portions are cut along the illustrated vertical and horizontal grooves 206 separating the die portions. Upon this cutting in the middle of horizontal and vertical grooves 206, the lateral conductive traces 215 and portions 215a of each of these traces remains on the edge of the die portion 208 to form a corresponding portion of the lateral interconnect structure (FIG. 1) of each die portion. The rectangular sections in the vertical and horizontal grooves 206 represent the lateral conductive traces 215 and portions 215a thereof, and are illustrated as rectangles in FIG. 12 merely to simplify the figure. The same is true regarding the labelling of the many contacts 212, conductive traces 213, lateral conductive traces 215 and portions 215a thereof in FIG. 12. Only one contact 212, conductive trace 213, lateral conductive trace 215 and portion 215a thereof is labelled in FIG. 12 to simplify the figure.

Figure 13:
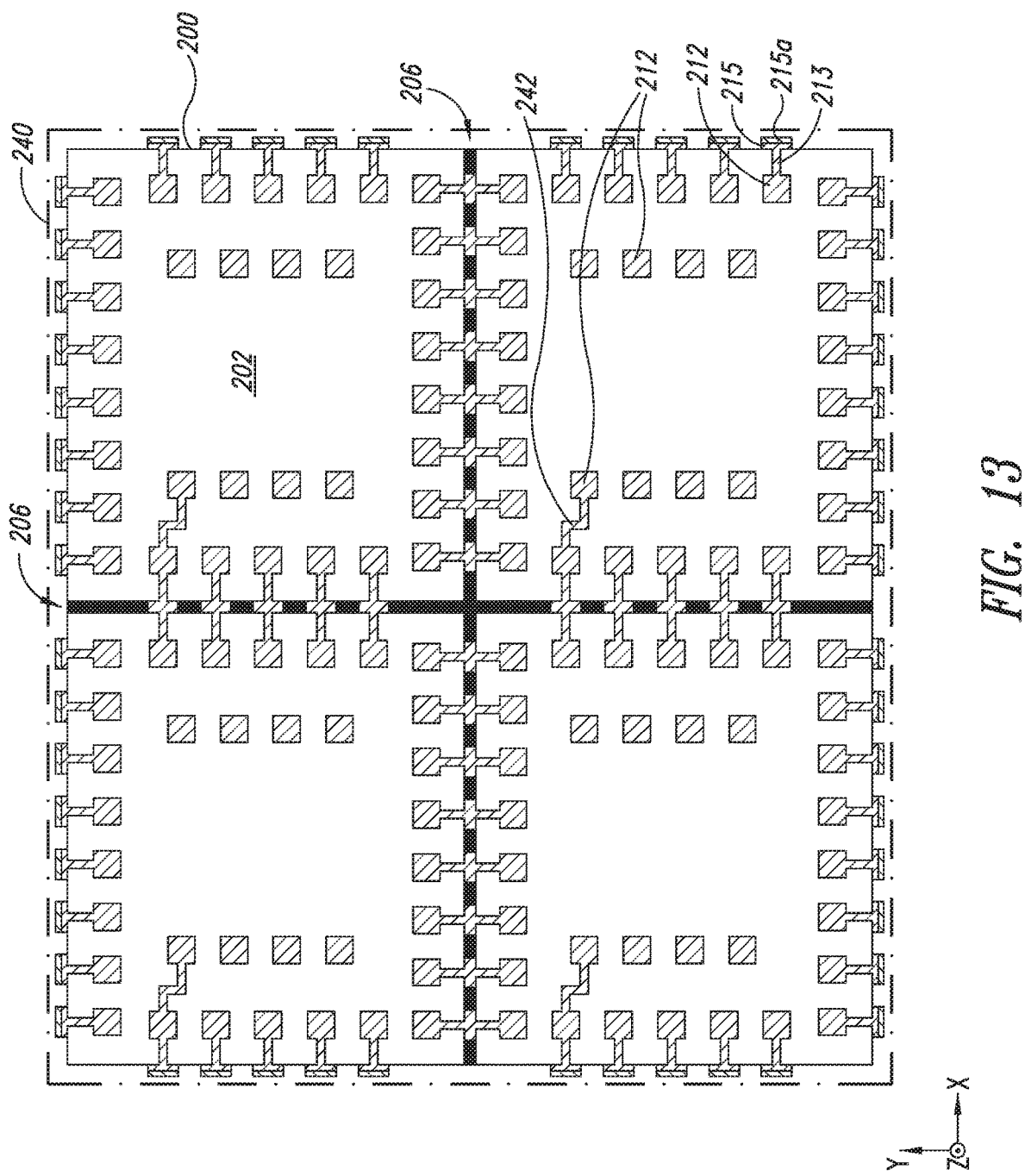
FIG. 13 is a top view showing a portion of the wafer of FIG. 3 that illustrates ink printed peripheral and interior contact pads and traces formed on this wafer.

FIG. 13 is a top view showing a portion of the wafer 200 of FIG. 3 that illustrates the embodiment of FIG. 12 further including ink printed interior contact pads or contacts 212 on the upper surface 202 of the wafer. The peripheral contacts 212 and interior contacts are printed on the upper surface 202 of the as required to provide for subsequent formation of the required electrical connections 224 to a second wafer 220 as shown in and previously discussed with reference to FIGS. 6-11. Some of the interior contacts 212 may be interconnected to lateral conductive traces 215 through further conductive traces 242 of printed conductive ink 210 on the surface 202. Other ones of the interior contacts 212 may not be coupled to the lateral interconnect structure 216 including the lateral conductive traces 215. Instead, these interior contacts 212 provide interconnection to another die portion position over the die portion 208 of FIG. 13 during assembly, as discussed above with reference to FIGS. 5-11. The numbers and specific arrangement of the interior and peripheral contacts 212 are formed as required to provide the required electrical interconnection between the integrated circuits in the die portions 208 of wafer 200 and the integrated circuits formed in the die portions of the second wafer 220 (FIG. 6). The term "interior" contact 212 is used to refer to contacts that are positioned closer to the center of each die portion 208 than are peripheral contacts positioned adjacent a periphery of the die portion.

Figure 14:
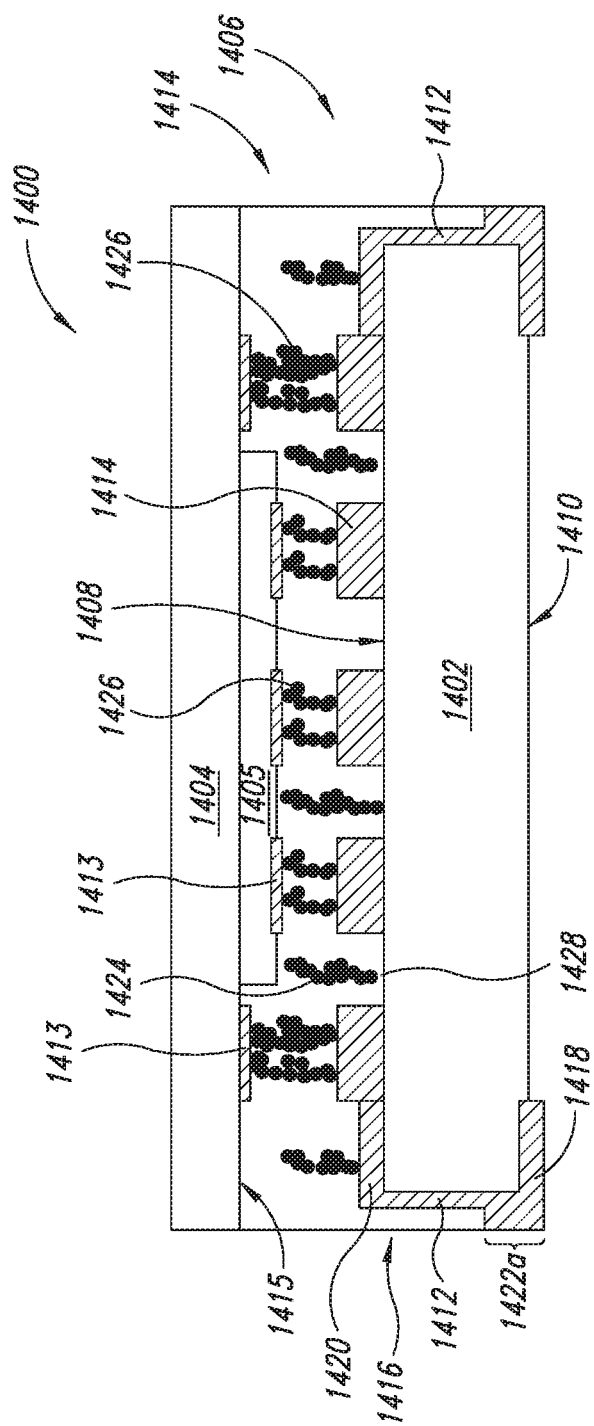
FIG. 14 is cross-sectional view of a package including multiple stacked die coupled through an interconnection structure according to another embodiment of the present disclosure.

FIG. 14 is cross-sectional view of a package 1400 including multiple stacked die 1402, 1404, 1405 coupled through an interconnection structure 1406 according to another embodiment of the present disclosure. In the embodiment of FIG. 14, the elements 1402-1426 are the same as or substantially similar to the components 102-126 in the embodiment of FIG. 1, and will accordingly not again be described in detail with reference to FIG. 14. In the embodiment of FIG. 14, an additional die 1405 is attached to the surface 1415 of the die 1404 that faces the surface 1408 of die 1402.

Thus, the die 1405 is positioned between the two die 1402, 1404. The die 1405 is attached to surface 1415 of die 1404 through any attachment technique, such as being attached with epoxy. In the embodiment of FIG. 14, the die 1405 is attached to a portion of the die 1404 containing no contacts 1413 that are to be electrically coupled to the die 1402 or to an external circuit (not shown) through the interconnect structure 1406. The die 1405 includes partially-recessed contacts 1428 formed on a surface 1430 that is facing the surface 1408 of the die 1402. Each of the contacts 1428 is positioned to align with a corresponding contact 1414 on the die 1402.

In assembling the package 1400, the die 1405 is first attached to the die 1404, and then this resulting structure is positioned on the uncured anisotropic conductive paste 1414 placed on the die 1402 in the same way as described with reference to FIGS. 4 and 5. The anisotropic conductive paste 1414 is then cured to form electrical connections 1426 between contacts 1413 on the die 1404 and contacts 1412 on the die 1402, and between the contacts 1428 on the die 1405 and contacts 1412 on the die 1402. In this way, the interconnect structure 1406 provides for the electrical interconnection among the die 1402, 1404 and 1405 and for the electrical connection of these die to an external circuit (not shown) through the contacts 1418 on the surface 1410 of the die 1402.

Although not shown in FIG. 14, the die 1405 could include contacts on the surface of the die facing the surface 1415 of die 1404. In this situation, the die 1404 would include contacts 1413 positioned where the die 1405 is to be attached. This attachment includes electrical interconnection of the contacts 1413 on die 1404 to the contacts on the surface of the die 1405 facing the surface 1415 of die 1404. Furthermore, although the contacts 1428 on the surface 1430 of the die 1405 are shown as being partially-recessed contacts, the die 1405 includes other types of contacts, such as contacts formed on the surface 1430, in other embodiments of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A die structure, comprising:
    a first die including a first surface and a second surface opposite the first surface, the first die including sidewalls extending between the first and second surfaces;
    conductive ink printed traces including a first group of the conductive ink printed traces on the first surface of the first die, a second group of the conductive ink printed traces on the second surface of the first die, and a third group of the conductive ink printed traces on the sidewalls of the first die, wherein the first group of the conductive ink printed traces on the first surface of the first die includes a plurality of conductive ink printed traces coupled to some of a plurality of conductive ink printed contacts;
    a second die having a first surface and a second surface, the first surface of the second die facing the first surface of the first die and including a plurality of traces on the first surface of the second die, each of the plurality of conductive ink printed traces having a first thickness extending towards the first surface of the second die in a direction orthogonal to the first surface of the first die, and each of the plurality of conductive ink printed contacts having a second thickness extending towards the first surface of the second die in the direction orthogonal to the first surface of the first die, the second thickness being greater than the first thickness; and
    an anisotropic conductive paste positioned between the first surfaces of the first and second dies, the anisotropic conductive paste including an encapsulant and a plurality of magnetic beads coupled between the plurality of conductive ink printed contacts on the first surface of the first die and the plurality of traces on the first surface of the second die, the encapsulant of the anisotropic conductive paste covering the third group of the conductive ink printed traces on the sidewalls of the first die except for a first portion of the third group of the conductive ink printed traces exposed from the encapsulant as a sidewall contact, the sidewall contact being more adjacent to the second surface of the first die than to the first surface of the first die.

2. The die structure of claim 1, wherein the first die includes a periphery and wherein the first group of conductive ink printed traces includes peripheral contacts.

3. The die structure of claim 2, wherein the first group of conductive ink printed traces further includes interior contacts on the first surface of the first.

4. The die structure of claim 1, wherein each of the first die and the second die comprises an application specific integrated circuit.

5. The die structure of claim 1, further comprising:
    a third die having a first surface attached to the first surface of the second die and having a second surface opposite the first surface and facing the first surface of the first die, the second surface of the third die including a plurality of traces,
    wherein the anisotropic conductive paste is further positioned between the second surface of the third die and the first surface of the first die, and wherein the anisotropic conductive paste includes the plurality of magnetic beads coupled to the plurality of traces on the second surface of the third die and the first group of conductive ink printed traces on the first surface of the first die.

6. The die structure of claim 1, wherein each of the third group of the conductive ink printed traces on the sidewalls of the first die comprises a first portion having a first thickness in a direction orthogonal to the sidewall, and a second portion having a second thickness in the direction orthogonal to the sidewall, the second thickness greater than the first thickness.

7. A die structure, comprising:
    a first semiconductor die including a first surface and a second surface opposite the first surface, the first semiconductor die including sidewalls extending between the first and second surfaces;
    conductive ink printed traces including a first group of the conductive ink printed traces on the first surface of the first semiconductor die, the first group of conductive ink printed traces having a first thickness extending outward from the first surface, a second group of the conductive ink printed traces on the second surface of the first semiconductor die, and a third group of the conductive ink printed traces on the sidewalls of the first semiconductor die;

conductive ink printed contacts on the first surface of the first semiconductor die, the conductive ink printed contacts having a second thickness extending outward from the first surface, the second thickness being greater than the first thickness;

a second semiconductor die having a first surface and a second surface, the first surface of the second semiconductor die facing the first surface of the first semiconductor die and including a plurality of conductive traces on the first surface of the second semiconductor die; and an anisotropic conductive paste positioned between the first surfaces of the first semiconductor die and the second semiconductor die, the anisotropic conductive paste including an encapsulant and a plurality of magnetic beads extending through the encapsulant to electrically couple the conductive traces on the first surface of the second semiconductor die and the conductive ink printed contacts on the first surface of the first semiconductor die, the encapsulant of the anisotropic conductive paste covering the third group of the conductive ink printed traces on the sidewalls of the first semiconductor die except for a first portion of the third group of the conductive ink printed traces exposed from the encapsulant as a sidewall contact, the sidewall contact being more adjacent to the second surface of the first semiconductor die than to the first surface of the first semiconductor die.

8. The die structure of claim 7, further comprising a third semiconductor die attached to the first surface of the second semiconductor die and having a surface facing the first surface of the first semiconductor die, and the surface of the third semiconductor die including a plurality of conductive traces, the anisotropic conductive paste being positioned between the surface of the third semiconductor die and the first surface of the first semiconductor die and including a plurality of magnetic beads coupled to the plurality of conductive traces on the surface of the third semiconductor die and the conductive ink printed contacts on the first surface of the first semiconductor die.

9. A method, comprising:
forming a plurality of trenches in a first surface of a first wafer, the first wafer including a first surface and a second surface opposite the first surface and each of the plurality of trenches extending from the first surface partially towards the second surface;
printing a plurality of conductive ink contacts on the first surface of the first wafer, each of the plurality of conductive ink contacts having a first thickness;
printing a plurality of conductive ink traces in the plurality of trenches and on the first surface of the first wafer, the plurality of conductive ink printed traces including a first group of the conductive ink printed traces on the first surface of the first wafer and electrical contact with but not overlying some of the plurality of conductive ink contacts, each of the plurality of conductive ink printed traces having a second thickness that is less than the first thickness, and the plurality of conductive ink traces including a second group of the conductive ink printed traces in the plurality of trenches;

dispensing an anisotropic conductive paste on the first surface of the first wafer and on the printed plurality of conductive ink traces, the anisotropic conductive paste including an encapsulant and a plurality of electrically conductive and magnetic beads, the anisotropic conductive paste filling the plurality of trenches over the plurality of conductive ink traces printed in the plurality of trenches;

placing a second wafer on the dispensed anisotropic conductive paste, the second wafer including a first surface facing the anisotropic conductive paste and including a plurality of traces on the first surface of the second wafer;

applying a magnetic field to the first and second wafers and the anisotropic conductive paste to align the plurality of magnetic beads to form electrical connections between the plurality of conductive ink contacts on the first surface of the first wafer and the plurality of traces on the first surface of the second wafer;

curing the anisotropic conductive paste; and forming a die by cutting the first and the second wafers through a first trench of the plurality of trenches, a sidewall of the die including the anisotropic conductive paste and an exposed portion of at least one of the plurality of conductive ink traces printed in the first trench.

10. The method of claim 9, further comprising removing portions of the second surface of the first wafer to expose the plurality of conductive ink traces in the plurality of trenches.

11. The method of claim 9, further comprising printing conductive ink traces on the second surface of the first wafer and on the exposed plurality of conductive traces in the plurality of trenches.

12. The method of claim 11, further comprising cutting the first and second wafers along the plurality of trenches.

13. The method of claim 9, wherein forming the plurality of trenches in the first surface of the first wafer comprises:
forming a plurality of trenches extending along a first direction on the first surface of the first wafer; and
forming a plurality of trenches extending along a second direction of the first surface of the first wafer, the second direction being orthogonal to the first direction.

14. The method of claim 9, wherein each of the plurality of plurality of trenches comprises sidewalls and a bottom wall, and wherein printing the plurality of conductive ink traces in the plurality of trenches comprises conformally printing the plurality of conductive ink traces on the sidewalls and the bottom wall of the plurality of trenches.

15. The method of claim 9, wherein curing the anisotropic conductive paste comprises one of applying heat to the encapsulant of the anisotropic conductive paste and exposing the encapsulant of the anisotropic conductive paste to light of a particular wavelength.

16. The method of claim 9, further comprising forming electronic circuitry in each of the first and second wafers.

* * * * *

UNITED STATES PATENT AND TRADEMARK OFFICE
CERTIFICATE OF CORRECTION

PATENT NO. : 10,770,432 B2
APPLICATION NO. : 15/919871
DATED : September 8, 2020
INVENTOR(S) : Federico Giovanni Ziglioli Page 1 of 1

It is certified that error appears in the above-identified patent and that said Letters Patent is hereby corrected as shown below:

In the Claims

Column 10, Line 29, Claim 3:
"first." should read, --first die.--.

Signed and Sealed this
Fifteenth Day of December, 2020

Andrei Iancu
*Director of the United States Patent and Trademark Office*